United States Patent
Staudinger et al.

(10) Patent No.: US 7,957,707 B2
(45) Date of Patent: Jun. 7, 2011

(54) SYSTEMS, APPARATUS AND METHOD FOR PERFORMING DIGITAL PRE-DISTORTION BASED ON LOOKUP TABLE GAIN VALUES

(75) Inventors: Joseph Staudinger, Gilbert, AZ (US); George B. Norris, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 700 days.

(21) Appl. No.: 11/693,897

(22) Filed: Mar. 30, 2007

(65) Prior Publication Data

US 2008/0243899 A1  Oct. 2, 2008

(51) Int. Cl.
*H04B 1/04* (2006.01)
*H01Q 11/12* (2006.01)

(52) U.S. Cl. ............... 455/114.2; 455/114.3; 455/127.2; 375/297

(58) Field of Classification Search ............ 455/91, 455/114.2–114.3, 126, 127.1–127.2; 375/295–297
See application file for complete search history.

(56) References Cited

U.S. PATENT DOCUMENTS

| | | | | |
|---|---|---|---|---|
| 6,907,085 B2 * | 6/2005 | Kubo et al. | | 375/285 |
| 7,034,613 B2 * | 4/2006 | Saed | | 330/149 |
| 7,106,133 B2 * | 9/2006 | Hamada et al. | | 330/149 |
| 7,109,792 B2 * | 9/2006 | Leffel | | 330/149 |
| 7,295,066 B2 * | 11/2007 | Saed | | 330/149 |
| 7,333,559 B2 * | 2/2008 | Song et al. | | 375/296 |
| 7,403,573 B2 * | 7/2008 | DeBruyn et al. | | 375/297 |
| 7,412,469 B2 * | 8/2008 | Dalipi | | 708/300 |
| 7,514,996 B2 * | 4/2009 | Furuta et al. | | 330/149 |
| 7,535,298 B2 * | 5/2009 | Sihlbom et al. | | 330/149 |
| 7,733,978 B2 * | 6/2010 | Lin et al. | | 375/297 |
| 2004/0179629 A1 * | 9/2004 | Song et al. | | 375/296 |
| 2005/0085199 A1 | 4/2005 | Khan et al. | | |
| 2005/0190857 A1 * | 9/2005 | Braithwaite | | 375/296 |
| 2008/0130789 A1 * | 6/2008 | Copeland et al. | | 375/297 |

OTHER PUBLICATIONS

Muhonen, K., et al., Look-up table techniques for adaptive digital predistortion: A development and comparasion, IEEE Transactions on Vehicular Technology, vol. 49, No. 5, Sep. 2000.
Digital Predistortion Reference Design, Application Note AN-314-1.0, Jul. 2003, Altera Corporation, pp. 1-46.

* cited by examiner

*Primary Examiner* — Simon D Nguyen
(74) *Attorney, Agent, or Firm* — Ingrassia Fisher & Lorenz, P.C.

(57) ABSTRACT

A system (100, FIG. 1) performs digital pre-distortion using gain values stored in a lookup table (150). A method for performing digital pre-distortion includes identifying (310, FIG. 3) a lookup table entry, based on input data, and updating the lookup table entry by writing an updated gain value into the lookup table entry. In an embodiment, update tracking information corresponding to the lookup table entry may be updated (324) to indicate that the lookup table entry has been updated. Another embodiment includes identifying (412, FIG. 4) consecutive lookup table entries based on input data, determining (413) whether the consecutive lookup table entries have been previously updated, and performing (414) a weighted interpolation process to produce an output gain value. A previous gain value (158, FIG. 1) is used in the weighted interpolation process when at least one of the consecutive lookup table entries has not been updated.

18 Claims, 4 Drawing Sheets

SYSTEMS, APPARATUS AND METHOD FOR PERFORMING DIGITAL PRE-DISTORTION BASED ON LOOKUP TABLE GAIN VALUES

TECHNICAL FIELD

Embodiments of the inventive subject matter relate to digital pre-distortion systems, apparatus, and methods, and more particularly to lookup table initialization and updating methods performed within digital pre-distortion systems.

BACKGROUND

Some electronic systems include devices (e.g., radio frequency (RF) power amplifiers), which add distortion to a signal during processing. Such devices are referred to as "non-linear" devices, when the added distortion is non-linear in nature. Digital pre-distortion (DPD) systems have been used in the past to compensate for the intrinsic distortion characteristics of non-linear devices. A traditional DPD system determines the differences between an input signal and a feedback signal from the system output. An inverse gain signal, which inversely reflects the differences, is combined with the input signal to produce a "pre-distorted" signal. In many cases, this process results in effective cancellation of the distortion (i.e., the non-linearities) produced within the system, and a more linear output signal may result.

Lookup tables have been used to store inverse gain values. In some traditional DPD systems, an initialization and training process is performed prior to transmission of actual input data, in order to determine the inverse gain values within the lookup table. Using this process, a training sequence is applied to the system, during which time the inverse gain values are adapted to reflect the system's distortion characteristics. After completion of the training process, actual input data is then combined with the adapted inverse gain values, and the combined signal is transmitted. In other traditional DPD systems, a training process is not performed. Instead, the lookup table values are set to pre-defined, "blind" settings. The blind settings do not reflect the actual, then-current distortion characteristics, but instead reflect a pre-defined estimate of the distortion characteristics. At the onset of a transmission burst, the blind settings are applied to the actual input data to attempt to compensate for the distortion. Eventually, the inverse gain values may adapt to more accurately reflect the actual distortion characteristics.

The prior DPD systems described above suffer from several drawbacks. In particular, DPD systems that use training processes may add considerable complexity, hardware, and cost to transmitter systems. In addition, timing issues (e.g., issues relating to the burst/slot/frame structure) may preclude the use of training processes. Although, DPD systems that use "blind" settings of initial lookup table values may overcome some of these disadvantages, they suffer from other disadvantages. For example, the linearization performance of these DPD systems are strongly coupled to the choice of initial inverse gain values in the lookup table. In environments in which the distortion characteristics are not well known and/or change considerably with environmental conditions and/or transmitter operation, poor initial performance may result from inaccurate initial inverse gain values. In some cases, when the initial inverse gain values are substantially inaccurate, the system may not be able to converge. Further, these DPD systems may perform poorly when adapting infrequently accessed lookup table entries (e.g., entries for which there is a low probability of selection). For at least the above reasons, a need exists for DPD systems and methods that provide more accurate lookup table initialization and updating, without the delays inherent in performing training processes.

DETAILED DESCRIPTION

Embodiments described herein include methods and apparatus for performing digital pre-distortion in a system that includes a lookup table. Embodiments described herein also include methods and apparatus for initializing and updating a lookup table of a digital pre-distortion apparatus. The various embodiments may provide one or more advantages over traditional digital pre-distortion systems. For example, embodiments of the inventive subject matter may use actual input data samples, rather than training sequences, to initialize and update a lookup table, which may avoid adding complexity, hardware, and cost to a system, and also may avoid issues that may preclude the use of training sequences. Further, embodiments of the inventive subject matter may provide better linearization performance and an increased likelihood of convergence over traditional systems that use blind settings of initial lookup table values, particularly in environments in which a system's distortion characteristics are not well known and/or change considerably with environmental conditions and/or transmitter operation.

Figure 1:
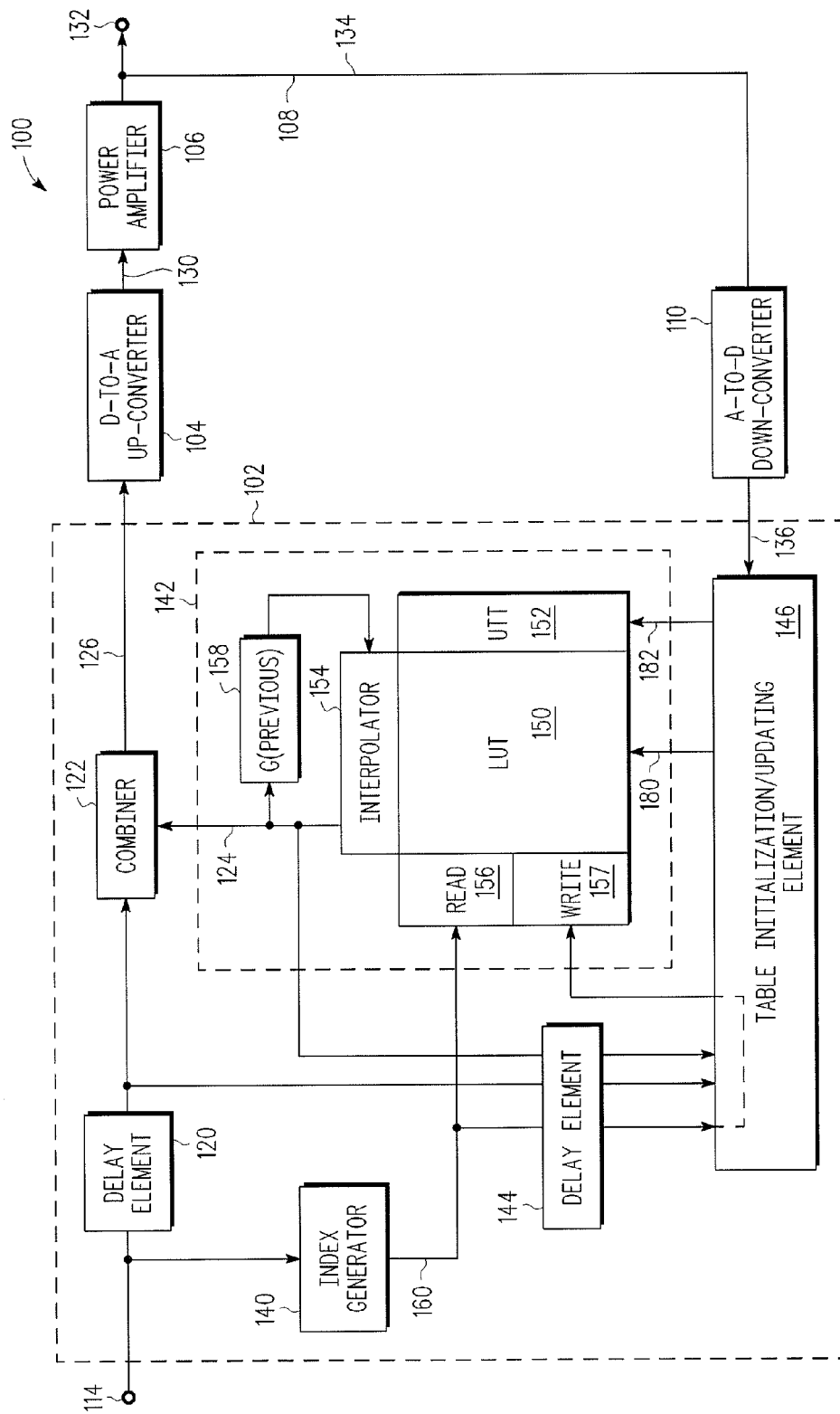
FIG. 1 illustrates a simplified block diagram of an electronic system having a digital pre-distortion (DPD) apparatus, in accordance with an example embodiment of the inventive subject matter.

FIG. 1 illustrates a simplified block diagram of electronic system 100 having a digital pre-distortion (DPD) apparatus 102, in accordance with an example embodiment of the inventive subject matter. Electronic system 100 may form a portion of any apparatus that is includes a DPD apparatus, including but not limited to apparatus that transmit signals over a wireless medium. These apparatus include, but are not limited to, a cellular telephone, a radio, a two-way pager, a personal data assistant, a computer (e.g., a laptop or desktop computer), a satellite, a relay, a repeater, a stereo amplifier, a remote control device, a wireless transmitter, and/or a wireless transceiver, to name a few.

Electronic system 100 includes DPD apparatus 102, digital-to-analog (D-to-A) converter and frequency up-converter 104 (herein "up-converter 104"), power amplifier 106, feedback path 108, and analog-to-digital (A-to-D) converter and frequency down-converter 110 (herein "down-converter 110"), in an embodiment. These system elements form at least a portion of a transmit path and a feedback path for electronic system 100. Electronic system 100 may include additional system elements (not illustrated) such as, for example, one or more input data sources, receive path system elements, signal processing components, data storage components, and/or user interfaces, to name a few. For purposes of clarity only, these additional system elements are not illustrated in FIG. 1. Further, although FIG. 1 illustrates a DPD apparatus 102 used in the context of a transmit path for an electronic system, DPD apparatus of various embodiments may alternatively be used in a receive path for an electronic system, and/or within other electronic systems that include one or more amplifiers and/or other non-linear devices for which digital pre-distortion may be desired. Accordingly, the scope of the inventive subject matter is intended to include DPD apparatus used in a variety of different types of systems.

DPD apparatus 102 receives input data samples 114, X(k), which may be produced by an input data sample generator (not illustrated). Input data samples 114 may include, for example, a sequence of discrete time samples of a signal to be transmitted (e.g., a transmission burst). In an embodiment, input data samples 114 include a sequence of complex values represented in Cartesian coordinates, so that each value has a real part (I) and an imaginary part (Q). Accordingly, input data samples 114 may include a sequence of values that may be represented as X(k)=[I(k), Q(k)], where k indicates a sample number and k=1 . . . K, I(k) represents a real part of an input data sample, and Q(k) represents an imaginary part of an input data sample. In alternate embodiments, input data samples 114 may include sequences of values represented in polar coordinates or some other representation.

Figure 2:
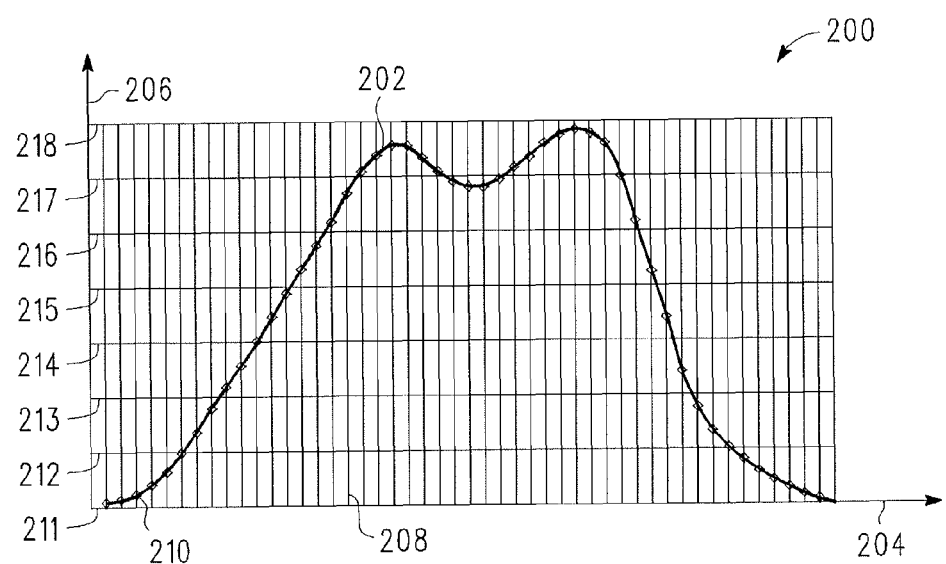
FIG. 2 illustrates a representation of a sampled input signal, in accordance with an example embodiment.

FIG. 2 is a graph 200 illustrating a sampled input signal 202 (e.g., from which input data samples 114, FIG. 1 may be determined), in accordance with an example embodiment. Input signal 202 could represent, for example, a signal burst produced using any of a number of technologies, including GSM (Global System for Mobile communications, or Groupe Special Mobile), EDGE (Enhanced Data rates for GSM Evolution), TDMA (Time-Division Multiple Access), CDMA (Code Division Multiple Access), W-CDMA (Wireless CDMA) or some other technology. Graph 200 includes a time axis 204 and a magnitude axis 206, and accordingly variations in the input signal magnitude with respect to time is represented in FIG. 2. For example, magnitude axis 206 could correspond to the vector magnitude of X(k), in an embodiment, although magnitude axis 206 alternatively could correspond to the magnitude of I(k) or Q(k), in other embodiments. Vertical lines 208 indicate sampling moments, and samples 210 are indicated by diamonds along input signal 202. For purposes of illustration, only 48 samples 210 are indicated for input signal 202. In actuality, significantly more samples may be produced (e.g., thousands), depending on the sampling rate of the system. Horizontal lines indicate magnitude thresholds 211, 212, 213, 214, 215, 216, 217, 218. As will be described in detail later, each magnitude threshold 211-218 may correspond to an entry within a lookup table 150 (FIG. 1).

Referring again to FIG. 1, in an embodiment, DPD apparatus 102 includes first delay element 120, combiner 122, index generator 140, gain value generator 142, second delay element 144, and table initialization/updating element 146. Gain value generator 142 includes lookup table 150 (LUT), update tracking table 152 (UTT), interpolator 154, read logic 156, and write logic 157, in an embodiment. In addition, gain value generator 142 also may includes a previous gain register 158 or a memory location for storing a previous gain value, G(previous), as will be described in more detail later.

First delay element 120 is adapted to delay an input data sample 114, X(k), by period of time (e.g., a number of clock cycles) corresponding to the amount of time it takes for DPD apparatus 102 to produce an appropriate output gain value 124, G(k), for combination with the input data sample 114. Combiner 122 is adapted to combine the delayed input data samples 114 with the gain values 124, in order to produce pre-distorted data samples 126, $X_p(k)$. Details regarding production of gain values 124 will be described in detail in subsequent paragraphs. In an embodiment, each output gain value 124 includes a complex value represented in Cartesian coordinates. For example, a complex output gain value 124 may be represented as $G(k)=[G_r(k),G_i(k)]$, where G(k) is a complex gain value to be applied to the $k^{th}$ input data sample, X(k). $G_r(k)$ represents a real component of the complex gain value, and $G_i(k)$ represents an imaginary component of the complex gain value. In other embodiments, each gain value may be represented in polar coordinates or some other gain representation. In an embodiment, the combination of the input data samples 114 with the gain values 124 (i.e., the pre-distorted data samples 126) may be represented as $X_p(k)=(I(k)+jQ(k))\times(G_r(k)+jG_i(k))=[I_p(k), Q_p(k)]$. $I_p(k)$ represents the real part of a pre-distorted data sample 126, and $Q_p(k)$ represents an imaginary part of a pre-distorted data sample 126.

Up-converter 104 is adapted to receive and perform a D-to-A conversion of the pre-distorted data samples 126. In an embodiment, up-converter 104 also is adapted to up-convert the analog version of the pre-distorted data samples 126 from a first frequency (e.g., a baseband or intermediate frequency) to a second frequency (e.g., a carrier frequency). Up-converter 104 also may be adapted to perform filtering and/or pre-amplification, in an embodiment. Up-converter 104 produces an up-converted analog signal 130. Power amplifier 106 is adapted to receive and amplify the up-converted analog signal 130, and to produce an amplified analog signal 132, which may be transmitted by transmit subsystem (not illustrated) or otherwise processed. Transmission may occur over a wired or wireless communications medium.

During system operations, up-converter 104 and/or power amplifier 106 may introduce a significant amount of non-linearity (i.e., distortion) into the amplified analog signal 132. In addition, the distortion produced by up-converter 104 and/or power amplifier 106 may change over time based on a variety of factors. For example, but not by way of limitation, factors affecting distortion may include transmission frequency, modulation scheme, temperature, physical position, and/or transmission power, among other things. As used herein, the term "non-linear device" refers to any device that has intrinsic distortion characteristics such that the device may introduce non-linear distortion into a signal that is processed by the device. Up-converter 104 and power amplifier 106 may be considered non-linear devices, in the illustrated embodiment. One or more other non-linear devices may be present in a signal path as well, including additional amplifiers, filters, converters, and/or other devices. The term "cumulative signal distortion" refers to the combined distortion that may be applied to a signal by one or more non-linear devices along a processing chain.

Gain value generator 142 is adapted to generate a sequence of output gain values 124, so that combination of the output gain values 124 with the input data samples 114 pre-distorts the samples in a manner that mitigates the distortion produced by one or more non-linear devices (e.g., up-converter 104 and/or power amplifier 106) within system 100. In an embodiment, the output gain values 124 are generated based on entries within a lookup table 150 (LUT), which will be described in detail later, and gain value generator 142 is further adapted to maintain lookup table 150. The entries within the lookup table 150 may be initialized and updated, according to various embodiments, so that they may accurately compensate for the intrinsic distortion characteristics of the non-linear devices. In an embodiment, as will be described in detail later, the amplified analog signal 132 is fed back (e.g., via feedback path 108), processed and evaluated in order to generate gain values within lookup table 150.

To enable processing and evaluation of the amplified analog signal 132, feedback path 108 is adapted to provide, to down-converter 110, a feedback signal 134 that represents the amplified analog signal 132. In an embodiment, down-converter 110 is adapted to down-convert the feedback signal 134 to the frequency of the input data samples 114 (e.g., a baseband or intermediate frequency). Down-converter 110 may be further adapted to perform filtering and/or amplification of the feedback signal 134, as well as performing an A-to-D conversion of the down-converted feedback signal 134. Down-converter 110 produces down-converted data samples 136. In an embodiment, down-converted data samples 136 include a sequence of complex values represented in Cartesian coordinates. Accordingly, down-converted data samples 136 may include a sequence of values that may be represented as $X_d(k)=[I_d(k), Q_d(k)]$, where $I_d(k)$ represents a real part of a down-converted data sample 136, and $Q_d(k)$ represents an imaginary part of a down-converted data sample 136. In alternate embodiments, down-converted data samples 136 may include sequences of values represented in polar coordinates or some other representation. In still other embodiments, a system or apparatus may have other feedback configurations that the configuration illustrated in FIG. 1. For example, but not by way of limitation, other embodiments may exclude an up-converter/down-converter in the feedback path, and/or other configurations may include more, fewer or different elements in the feedback loop than up-converter 104, power amplifier 106, and down-converter 110.

As mentioned previously, lookup table 150 includes a plurality of entries, LUT(1 . . . N), and each lookup table entry may include a lookup table gain value. In an embodiment, the number of lookup table entries, N, may be in a range from 4 to 32, although lookup table 150 may include more or fewer entries, in other embodiments. The number of lookup table entries, N, may be a static number or may be variable, in various embodiments. Each entry, LUT(n), within lookup table 150 may include a complex gain value represented in Cartesian coordinates. For example, a complex gain value within lookup table 250 may be represented as $LUT(n)=[LUT_r(n), LUT_i(n)]$, where LUT(n) is a complex gain value, n is an index into the lookup table, and n=1 . . . N. $LUT_r(n)$ represents a real component of the complex gain value, and $LUT_i(n)$ represents an imaginary component of the complex gain value. In other embodiments, each entry may include a value represented in polar coordinates or some other gain representation.

Interpolator 154 is adapted to calculate the output gain value 124, G(k), which will be combined with the delayed input data sample, X(k). In various embodiments, interpolator 154 is adapted to produce the output gain value 124, G(k), by performing a weighted interpolation process using lookup table gain values stored within two consecutive lookup table entries, where the lookup table entries are determined based on an index 160, i(k), which is generated by index generator 140. As will be described in more detail in conjunction with FIG. 4, in some cases, interpolator 154 may calculate the output gain value 124, G(k), using a previously produced gain value, G(previous), which may be stored in previous gain register 158 or memory location. In an embodiment, the previously produced gain value, G(previous), is an output gain value that was produced for a "last" input data sample, or G(previous)=G(k−1). In other embodiments, the previously produced gain value, G(previous), may be an output gain value from some other, earlier output gain value, or may be a value derived from multiple, previously produced output gain values (e.g., an average or weighted average of multiple previously produced output gain values). The processes of generating an index, i(k), and calculating an output gain value 124, G(k), are described in detail in the next paragraphs.

Upon receipt of an input data sample 114 (e.g., a $k^{th}$ input data sample), index generator 140 may generate an index 160, i(k), into lookup table 150 for the $k^{th}$ input data sample. In various embodiments, the generated index may be determined based on a magnitude of I(k), a magnitude of Q(k), and/or a vector magnitude of X(k) for an input data sample 114. For purposes of explanation, the description below refers to generating the index based on a magnitude of X(k), such as is represented in FIG. 2. A lookup table index 160, i(k), includes a fixed point number, in an embodiment, and accordingly has an integer part, $i_{INT}(k)$, and a fractional part, $i_{FRAC}(k)$. Upon receipt of an input data sample 114, X(k), index generator 140 may determine i(k) as a scaled version of the sample's magnitude (e.g., a scaled version of X(k)).

When received by read logic 156 of gain generator 142, the integer part, $i_{INT}(k)$, of the lookup table index 160 is evaluated to determine two consecutive lookup table entries, a "floor" entry, $LUT(n_{floor})$, and a "ceiling" entry, $LUT(n_{ceil})$. In an embodiment, the two consecutive lookup table entries may be selected as $LUT(n_{floor})=LUT(i_{INT}(k))$ and $LUT(n_{ceil})=LUT(i_{INT}(k)+1)$. Gain generator 142 performs a weighted interpolation process using the lookup table gain values stored within the floor entry, $LUT(n_{floor})$, and the ceiling entry, $LUT(n_{ceil})$, in an embodiment, to produce the output gain value 124, G(k). Weighted interpolation processes used in calculating the output gain value 124, G(k), will be described in more detail later, in conjunction with FIGS. 3-4.

It is desirable that the lookup table gain values, LUT(n), within lookup table 150, include gain values that may converge to accurately reflect the cumulative signal distortion produced by up-converter 104, power amplifier 106, and/or other non-linear devices that may add distortion to the signal. Because the cumulative signal distortion may not be known with accuracy at the beginning of some transmissions (e.g., at the beginning of a series of bursts), the lookup table gain values may be initialized, in accordance with various embodiments. In addition, because the cumulative signal distortion may change over time, the lookup table gain values are updated over time to continue to accurately reflect the cumulative signal distortion, in an embodiment. Accordingly, the lookup table gain values are adaptive gain values, and the system provides adaptive, digital pre-distortion.

As mentioned above, in an embodiment, gain generator 142 includes an update tracking table 152 (UTT). Update tracking table 152 is adapted to store update tracking information, and includes a plurality of entries, UTT(1 . . . N), where each entry corresponds to an entry within lookup table 150, in an embodiment. Accordingly, LUT(1) corresponds to UTT(1), and so on. Update tracking information stored within an entry of update tracking table 152 may indicate whether a corresponding entry within lookup table 150 has been previously updated, in an embodiment. For example, when an update tracking table entry, UTT(n), includes a value of zero, it may indicate that the corresponding lookup table entry, LUT(n), has not been previously updated, and when the update tracking table entry, UTT(n), includes a non-zero value, it may indicate that the corresponding lookup table entry, LUT(n), has been previously updated. Other values may be used to indicate whether or not a lookup table entry has or has not been updated, in other embodiments. In a further embodiment, a value stored within an update tracking table entry, UTT(n), may indicate how many times the corresponding lookup table entry, LUT(n), has been updated. As will be described in more detail later, this information may be used in determining a gain delta value (e.g., gain delta value 180, described later) for a lookup table gain value. In another embodiment, the information within update tracking table 152 may be incorporated into lookup table 150 (e.g., each lookup table entry may include update tracking information). In still another embodiment, the information within update tracking table 152 may be excluded altogether from gain generator 142.

Initialization and updating of lookup table 150 primarily is performed by table initialization/updating element 146, in an embodiment. Initialization of lookup table 150 may include setting one or more lookup table entries to an initial value, as will be described in more detail later. Updating of lookup table 150 includes the process of updating the values within the lookup table entries to more accurately reflect the actual cumulative signal distortion through portions of the system 100. As will be described in more detail later, updating is based on analysis of actual signals being processed by the system 100, rather than training sequences, as is used in some traditional systems.

In an embodiment, an input data sample 114, X(k), and the lookup table index 160, i(k), are received by a second delay element 144, along with the output gain value 124, G(k), produced by gain generator 142 for that input data sample 114. Second delay element 144 is adapted to delay these values for an amount of time (e.g., a number of clock cycles) that will result in synchronization of the input data sample 114 with production of the corresponding down-converted data sample 136 (e.g., an amount of time that allows the input data sample 114 to be pre-distorted, up-converted, amplified, fed back, and down-converted by the system). Accordingly, second delay element 144 enables table initialization/updating element 146 to link an input data sample 114, X(k), with its corresponding down-converted data sample 136, $X_d(k)$, index 160, i(k), and output gain value 124, G(k).

Table initialization/updating element 146 is adapted to determine an error, E(k), as a function of the input data sample 114, X(k), and the down-converted data sample 136, $X_d(k)$. Based on the error, E(k), table initialization/updating element 146 is further adapted to calculate gain delta values 180, $\Delta LUT(n_{floor})$ and $\Delta LUT(n_{ceil})$, for the lookup table entries, $LUT(n_{floor})$ and $LUT(n_{ceil})$, indexed by the delayed lookup table index 172, i(k). In various embodiments, the gain delta values 180 may be calculated using least mean squares (LMS), normalized LMS, recursive least squares (RLS), or other algorithms known to those of skill in the art, based on the description herein. In an embodiment, the gain delta values 180 may be represented as $\Delta LUT(n_{floor})=[\delta G_{floor-r}, \delta G_{floor-i}]=\delta G_{floor-r}+j\delta G_{floor-i}$, and $\Delta LUT(n_{ceil})=[\delta G_{ceil-r}, \delta G_{ceil-i}]=\delta G_{ceil-r}+j\delta G_{ceil-i}$.

In an embodiment, table initialization/updating element 146 provides the gain delta values 180 to lookup table 150, which calculates updated gain values for the corresponding lookup table entries as $LUT(n_{floor})=LUT(n_{floor})+\Delta LUT(n_{floor})$ and $LUT(n_{ceil})=LUT(n_{ceil})+\Delta LUT(n_{ceil})$. The updated gain values may then be written into the floor and/or ceiling lookup table entries, $LUT(n_{floor})$ and/or $LUT(n_{ceil})$. In addition, in an embodiment, table initialization/updating element 146 produces a value or signal 182, which causes the corresponding entries, $UTT(n_{floor})$ and/or $UTT(n_{ceil})$, in the update tracking table 152 to indicate that the lookup table entries have been updated. As mentioned previously, in an embodiment, the values within the corresponding update tracking table entries may be incremented by one each time an update is performed. In another embodiment, the values within the corresponding update tracking table entries may be Boolean values, which simply indicate whether or not a corresponding lookup table entry has been updated. In an embodiment, as will be described later, when a lookup table entry LUT(n) has been initialized, a determination may be made whether one or more adjacent lookup table entries (e.g., LUT(n-2), LUT(n-1), LUT(n+1), LUT (n+2), and so on) have been initialized. If not, then the gain value within LUT (n) may be "pushed" into the one or more adjacent lookup table entries, in an embodiment.

Figure 3:
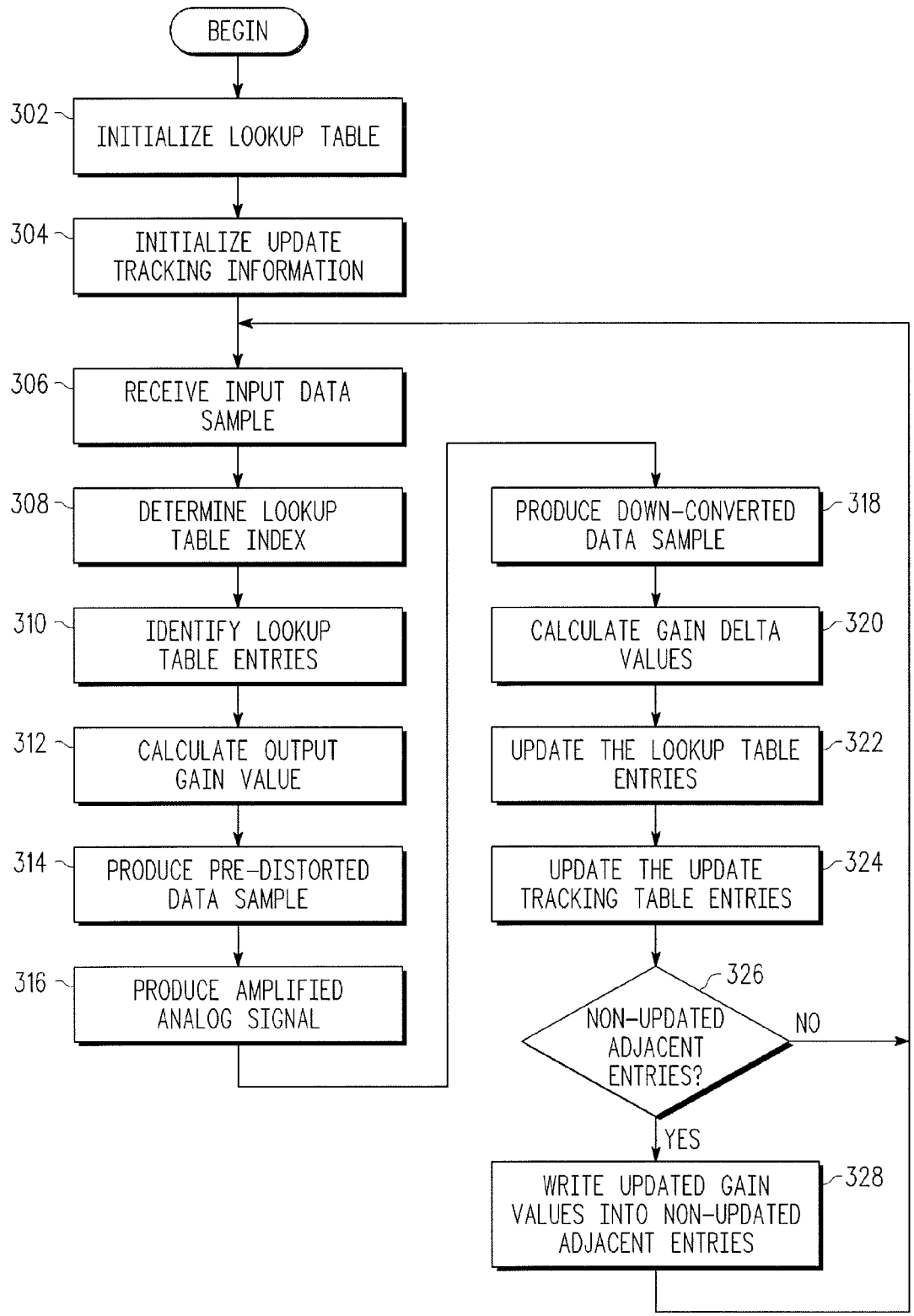
FIG. 3 illustrates a flowchart of a method for initializing and updating a lookup table, in accordance with an example embodiment.
Figure 4:
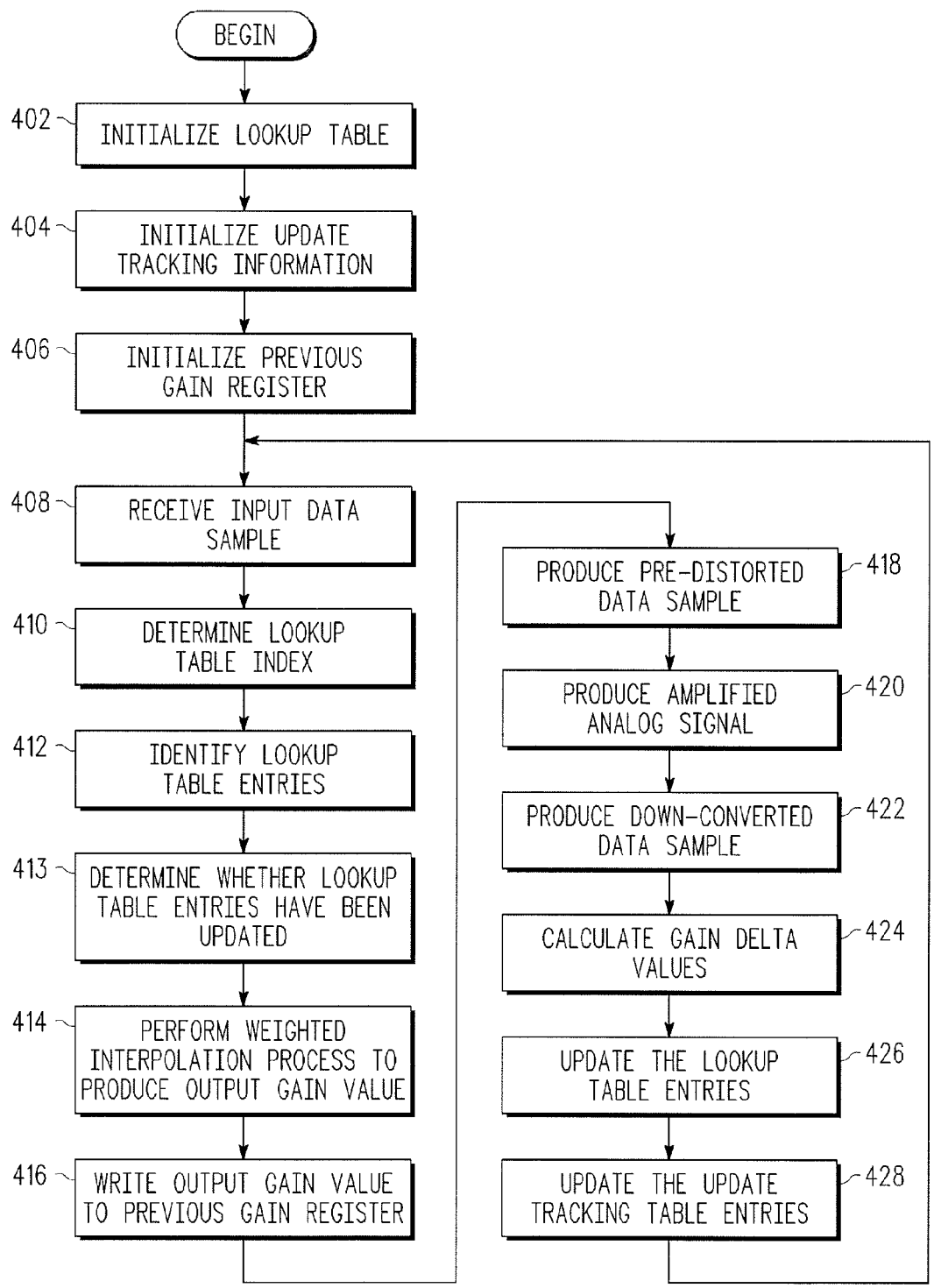
FIG. 4 illustrates a flowchart of a method for initializing and updating a lookup table, in accordance with another example embodiment.

A lookup table 150 may be initialized and re-initialized at various times. For example, a lookup table 150 may be initialized each time a burst is transmitted. In alternate embodiments, a lookup table 150 may be initialized after transmission of a pre-defined number of bursts, or after a predetermined period of time. In still other alternate embodiments, a lookup table may be initialized whenever a triggering event has occurred, where a triggering event may be an event that may potentially affected the intrinsic distortion characteristics of the electronic system. For example, but not by way of limitation, triggering events may include changes in a transmission frequency, modulation scheme, physical position, temperature, and/or transmission power, among other things. FIGS. 3-4 illustrate flowcharts of methods for initializing a lookup table, in accordance with various embodiments.

FIG. 3 illustrates a flowchart of a method for initializing and updating a lookup table (e.g., LUT 150, FIG. 1), in accordance with an example embodiment. The method begins, in block 302, by initializing the lookup table. In an embodiment, this includes writing an initial lookup table gain value into at least some of the multiple lookup table entries, LUT(n). In an embodiment, the initial lookup table gain value is a pre-defined gain value, $G_{INITIAL}$. In an embodiment, $G_{INITIAL}$ may be a complex value represented by [$G_{INITIALr}$, $G_{INITIALi}$]. In an embodiment, each $G_{INITIAL}=[1,0]$, or $G_{INITIALr}=1$ and $G_{INITIALi}=0$. In other embodiments, other initial values may be selected, and/or fewer than all lookup table entries may be set to initial values. In still another embodiment, none of the lookup table entries may be set to initial values, and any arbitrary values that may exist within the lookup table may simply be overwritten the first time the values are updated.

In an embodiment, the system maintains update tracking information, which indicates whether or not each of the lookup table entries has been updated. The update tracking information is maintained in an update tracking table (e.g., UTT 152, FIG. 1), in an embodiment. In another embodiment, the update tracking information may be maintained in an update tracking field of each lookup table entry.

Referring again to FIG. 3, the update tracking information is initialized, in block 304. In an embodiment, this includes writing initial values into the update tracking table entries, UTT(n). For example, each update tracking table entry may be set to an initial value that indicates that the corresponding lookup table entry has not yet been updated. In an embodiment, each update tracking table entry is set to an initial value of 0. In other embodiments, other initial values may be selected.

For example, in an embodiment, blocks 302 and 304 may be implemented according to the following sequence:

```
for p = 1:N
    LUT(p) = [1, 0]
    UTT(p) = 0
end
```

In block 306, an input data sample, X(k), (e.g., input data sample 114, FIG. 1) is received, stored, and/or delayed (e.g., by delay element 120 and/or delay element 144, FIG. 1) for later access. In addition, a lookup table index (e.g., lookup table index 160) for the received input data sample is determined, in block 308. In an embodiment, the lookup table index, i(k), is a function of the received input sample, or $i(k)=f\{X(k)\}=f\{I(k)+jQ(k)\}$, as described previously. In an embodiment, the lookup table index, i(k), is provided to a gain generator (e.g., gain generator 142, FIG. 1), as well as being stored and/or delayed (e.g., by delay element 144, FIG. 1) for later access.

In block 310, two, consecutive lookup table entries, LUT($n_{floor}$) and LUT($n_{ceil}$), are identified based on the input data sample, X(k), or more specifically, based on the lookup table index, i(k). In addition, in block 312, an output gain value, G(k), is calculated by performing a weighted interpolation process, as mentioned previously. The factional part, $i_{FRAC}$(k), of the lookup table index, i(k), may used to determine a weighting to apply to each of the two, consecutive lookup table entries, LUT($n_{floor}$) and LUT($n_{ceil}$), during the interpolation process. In an embodiment, the output gain value, G(k), is determined as:

$$G(k)=w_1(LUT(n_{floor}))+w_2(LUT(n_{ceil})),$$

where $w_1=1-i_{FRAC}(k)$ and $w_2=i_{FRAC}(k)$. During a first iteration of the method, LUT($n_{floor}$) and/or LUT($n_{ceil}$) may be the initial gain values that were stored in block 302.

For example, assume that a lookup table (e.g., lookup table 150, FIG. 1) includes eight entries, n=1 . . . 8. Referring also to FIG. 2, each of eight magnitude thresholds 211, 212, 213, 214, 215, 216, 217, 218 may correspond to one of the eight entries in the lookup table. For example, a first magnitude threshold 211 may correspond to LUT(1), a second magnitude threshold 212 may correspond to LUT(2), and so on. In the illustrated example, at least the first five samples 210 have magnitudes that fall between the first and second magnitude thresholds 211, 212. Accordingly, for the first five samples 210, a lookup table gain value may be based on an interpolation between the first and second lookup table entries, or LUT($n_{floor}$)=LUT(1) and LUT($n_{ceil}$)=LUT(2).

In block 314, the stored or delayed input data sample, X(k), and the output gain value, G(k), produced in block 312 are combined to produce a pre-distorted data sample (e.g., pre-distorted data sample 126, FIG. 1). The pre-distorted data sample, $X_p$(k), may then be D-to-A converted, up-converted, and amplified, in block 316, to produce an amplified analog signal (e.g., amplified analog signal 132, FIG. 1) that may be further processed, stored, and/or transmitted by a transmit subsystem. In addition, in block 318, the amplified analog signal may be fed back (e.g., via feedback loop 108, FIG. 1), down-converted, and A-to-D converted (e.g., by down-converter 110), to produce a down-converted data sample, $X_d$(k) (e.g., down-converted data sample 136, FIG. 1).

In block 320, gain delta values, ΔLUT($n_{floor}$) and ΔLUT($n_{ceil}$), are calculated based on an error, E(k), derived from the input data sample, X(k), and the down-converted data sample, $X_d$(k). From the gain delta values, updated gain values for the corresponding lookup table entries, LUT($n_{floor}$) and LUT($n_{ceil}$), are calculated, in block 322, and those lookup table entries are updated with the updated gain values. For example, the updated gain values may be calculated as LUT($n_{floor}$)=LUT($n_{floor}$)+ΔLUT($n_{floor}$) and LUT($n_{ceil}$)=LUT($n_{ceil}$)+ΔLUT($n_{ceil}$).

In block 324, the update tracking information within the update tracking table entries, UTT($n_{floor}$) and UTT($n_{ceil}$) also may be updated, in an embodiment, to indicate that the lookup table entries, LUT($n_{floor}$) and LUT($n_{ceil}$), have been updated. For example, in an embodiment, the values within UTT($n_{floor}$) and UTT($n_{ceil}$) may be incremented by one. In another embodiment, when the update tracking table includes simple Boolean values, the values within UTT($n_{floor}$) and UTT($n_{ceil}$) may be modified simply to indicate that at least one update has occurred, if they have not already been so modified.

In block 326, a determination is made whether any one or more lookup table entries that are considered to be "adjacent" to LUT$_{floor}$(k) and/or LUT$_{ceil}$(k) have not been updated, in an embodiment. For example, in an embodiment, "adjacent" lookup table entries to LUT$_{floor}$(k) may be all lookup table entries having lower indices into the lookup table, and "adjacent" lookup table entries to LUT$_{ceil}$(k) may be all lookup table entries having higher indices into the lookup table. In another embodiment, an "adjacent" lookup table entry to LUT$_{floor}$(k) may be any one or more lookup table entries having a lower index into the lookup table, and an "adjacent" lookup table entry to LUT$_{ceil}$(k) may be any one or more lookup table entries having a higher index into the lookup table. In an embodiment, a determination of whether or not a particular, adjacent lookup table entry, LUT(n), has been updated may be determined by evaluating the update tracking information within the corresponding entry within the update tracking table, UTT(n). For example, UTT(n) may include a value that indicates whether or not LUT(n) has been updated, as discussed previously.

When one or more adjacent lookup table entries have not been updated, then in block 328, the updated gain values, LUT($n_{floor}$) and/or LUT($n_{ceil}$), may be written into at least some of the one or more, non-updated, adjacent lookup table entries. For example, block 328 may be implemented according to the following sequence:

```
for p = 1:n_floor−1
    if UTT(p) == 0
        LUT(p) = LUT(n_floor)
    else
        do nothing
    end
end
for p = n_ceil+1:N
    if UTT(p) == 0
        LUT(p) = LUT(n_ceil)
    else
        do nothing
    end
end
```

In the embodiment described in the previous paragraph, the updated gain values written into LUT($n_{floor}$) and/or LUT($n_{ceil}$), are also written into one or more of the adjacent lookup table entries that have not been updated at all. In another embodiment, the updated gain values may be written into one or more adjacent lookup table entries that have been updated fewer than some threshold number of times. In an embodiment, a determination may be made whether an adjacent lookup table entry has been updated fewer than the threshold number of times. When the adjacent lookup table entry has been updated fewer than the threshold number of times, an updated gain value may be written into the adjacent lookup table entry. In a particular embodiment, the threshold number of times may be a constant value, Y, or the threshold may be some other value. For example, this embodiment of block 328 may be implemented according to the following sequence:

```
for p = 1:n_floor-1
    if UTT(p) <= Y
        LUT(p) = LUT(n_floor)
    else
        do nothing
    end
end
for p = n_ceil+1:N
    if UTT(p) <= Y
        LUT(p) = LUT(n_ceil)
    else
        do nothing
    end
end
```

In an embodiment, completion of block 328 completes the process of updating the lookup table and update tracking table for X(k). The method may then iterate, as shown, for subsequent input data samples.

FIG. 4 illustrates a flowchart of a method for initializing and updating a lookup table (e.g., LUT 150, FIG. 1), in accordance with another example embodiment. The method begins, in block 402, by initializing a lookup table by writing an initial value, $G_{INITIAL}$, into the lookup table entries, LUT (n), as discussed previously in conjunction with FIG. 3. In an embodiment that includes an update tracking table (e.g., UTT 152, FIG. 1), the update tracking table also may be initialized, in block 404, by writing initial values into the update tracking table entries, UTT(n), as was also discussed previously in conjunction with FIG. 3.

In block 406, a previous gain value, G(previous), is initialized. In an embodiment, this is accomplished by storing an initial previous gain value into a previous gain register (e.g., previous gain register 158, FIG. 1) and/or memory location. In an embodiment, the previous output gain value, G(previous), may be initialized to the same pre-defined, initial gain value, $G_{INITIAL}$, or to a different pre-defined, initial gain value. In an embodiment, the previous gain value is set to an initial value of [1, 0]. In other embodiments, other initial values may be selected.

In block 408, an input data sample, X(k), (e.g., input data sample 114, FIG. 1) is received, stored, and/or delayed (e.g., by delay element 120 and/or delay element 144, FIG. 1) for later access. In addition, a lookup table index (e.g., lookup table index 160) for the received input data sample is determined, in block 410, as described previously. In block 412, two, consecutive lookup table entries, LUT($n_{floor}$) and LUT ($n_{ceil}$), are identified based on the input data sample, X(k), or more specifically, based on the lookup table index, i(k), as discussed previously in conjunction with FIG. 3. A determination is made, in block 413, whether the consecutive lookup table entries have been updated. In an embodiment, this determination may be made by evaluating the update tracking information stored in the corresponding update tracking table entries, UTT($n_{floor}$) and UTT($n_{ceil}$).

In block 414, a weighted interpolation process is performed to produce an output gain value, G(k). In an embodiment, the output gain value, G(k), is determined as:

$$G(k)=w_1*A+w_2*B,$$

where $w_1=1-i_{FRAC}(k)$ and $w_2=i_{FRAC}(k)$. When at least one of the consecutive lookup table entries has not been updated, as determined in block 413, a previous gain value, G(previous), is used as at least one argument in the weighted interpolation process. For example, in an embodiment, when UTT($n_{floor}$) indicates that LUT($n_{floor}$) has been previously updated (e.g., UTT($n_{floor}$)>0), then A=LUT($n_{floor}$). Conversely, when UTT ($n_{floor}$) indicates that LUT($n_{floor}$) has not previously been updated (e.g., UTT($n_{floor}$)=0), then A=G(previous), in an embodiment. Similarly, when UTT($n_{ceil}$) indicates that LUT ($n_{ceil}$) has been previously updated (e.g., UTT($n_{ceil}$)>0), then B=LUT($n_{ceil}$). Conversely, when UTT($n_{ceil}$) indicates that LUT($n_{ceil}$) has not previously been updated (e.g., UTT($n_{ceil}$)= 0), then B=G(previous), in an embodiment.

In block 416, the output gain value, G(k), is stored as the previous gain value, G(previous), by writing the output gain value into the previous gain register (e.g., previous gain register 158, FIG. 1) or the memory location that stores G(previous), in an embodiment. In other words, G(previous) is set to G(k). In an alternate embodiment, in which the previous gain register stores a value that is calculated from a combination of previous gain values, G(previous) may be calculated using the output gain value, G(k), and one or more other previous gain values.

In block 418, the stored or delayed input data sample, X(k), and the gain value, G(k), produced in block 414 are combined to produce a pre-distorted data sample (e.g., pre-distorted data sample 126, FIG. 1). The pre-distorted data sample, $X_p(k)$, may then be D-to-A converted, up-converted, and amplified, in block 420, to produce an amplified analog signal (e.g., amplified analog signal 132, FIG. 1) that may be further processed, stored, and/or transmitted by a transmit subsystem. In addition, in block 422, the amplified analog signal may be fed back (e.g., via feedback loop 108, FIG. 1), down-converted, and A-to-D converted (e.g., by down-converter 110), to produce a down-converted data sample, $X_d(k)$ (e.g., down-converted data sample 136, FIG. 1).

In block 424, gain delta values, $\Delta LUT(n_{floor})$ and $\Delta LUT(n_{ceil})$, are calculated based on an error, E(k), derived from the input data sample, X(k), and the down-converted data sample, $X_d(k)$. In block 426, new values for the corresponding lookup table entries, LUT($n_{floor}$) and LUT($n_{ceil}$), are calculated, as discussed previously in conjunction with FIG. 3. The lookup table entries LUT($n_{floor}$) and LUT($n_{ceil}$), may then be updated with the updated gain values.

As discussed above, in block 416, the output gain value, G(k), is stored as the previous gain value, G(previous), by writing the output gain value into the previous gain register, or G(previous)=G(k). In another embodiment, block 416 is excluded, and instead a value that is a function of the new values for the lookup table entries LUT($n_{floor}$) and LUT($n_{ceil}$) is written into the previous gain register (e.g., previous gain register 158, FIG. 1). For example, in an embodiment, G(previous) may be determined as:

$$G(previous)=w_1(LUT(n_{floor}))+w_2(LUT(n_{ceil})),$$

where $w_1=1-i_{FRAC}(k)$ and $w_2=i_{FRAC}(k)$.

In block 428, the update tracking table entries, UTT($n_{floor}$) and UTT($n_{ceil}$) also may be updated, in an embodiment, to indicate that the lookup table entries, LUT($n_{floor}$) and LUT ($n_{ceil}$), have been updated, as discussed previously in conjunction with FIG. 3. In an embodiment, completion of block 428 completes the process of updating the lookup table and update tracking table for X(k). The method may then iterate, as shown, for subsequent input data samples.

It is to be understood that certain ones of the process blocks depicted in FIGS. 3-4 may be performed in parallel with each other for a particular sample, X(k), and also in parallel with performing these processes for previous or subsequent samples. In addition, it is to be understood that the particular ordering of the process blocks depicted in FIGS. 3-4 may be modified, while achieving substantially the same result. Further, inventive subject matter described in conjunction with FIGS. 3-4 may be combined into a particular embodiment.

Accordingly, such modifications are intended to be included within the scope of the inventive subject matter.

Embodiments described above have discussed signal processing based on values represented in Cartesian coordinates. In particular, the description has discussed that input data samples, X(k), pre-distorted data samples, Xp(k), down-converted data samples, Xd(k), and output gain values, G(k), among other values, may be represented in Cartesian coordinates. Accordingly, digital signal processing carried out by the system may be performed using techniques appropriate for Cartesian coordinate calculations. In other embodiments, some or all of the input data samples, X(k), pre-distorted data samples, Xp(k), down-converted data samples, Xd(k), output gain values, G(k), or other values, may be represented in polar coordinates or using other representations. It is to be understood that the scope of the inventive subject matter is intended to include embodiments in which digital signal processing carried out by the system may be performed using techniques appropriate for polar coordinate calculations or other types of calculations. Embodiments of the inventive subject matter may include other modifications, as well. For example, in another embodiment, a lookup table may be adapted to store a first value (e.g., an initial value) and a delta value for each entry. In such an embodiment, the system may maintain the first value and may change the delta value when a particular entry is being updated. To perform pre-distortion, the first value and the delta value may be combined with an input data sample (e.g., input data sample 114, FIG. 1). In still another embodiment, such as one that includes a lookup table with gain values stored in polar coordinates (e.g., gain and phase), the lookup table may more phase values stored therein than gain values. In addition, although it may be advantageous to use embodiments of the inventive subject matter in systems that use actual data in conjunction with initially updating the lookup table, embodiments alternatively may be used in conjunction with systems that use training sequences to initially update the lookup table.

Thus, various embodiments of digital pre-distortion methods and apparatus have been described. A particular embodiment includes a method for updating a lookup table of a digital pre-distortion system, where the lookup table includes multiple lookup table entries within which lookup table gain values may be stored. According to this embodiment, the method includes receiving an input data sample, and identifying, based on the input data sample, a first lookup table entry of the multiple lookup table entries. This embodiment further includes updating the first lookup table entry by writing an updated gain value into the first lookup table entry, and updating update tracking information corresponding to the first lookup table entry, to indicate that the first lookup table entry has been updated.

Another embodiment includes a method for performing digital pre-distortion in a system that includes a lookup table, where the lookup table includes multiple lookup table entries within which lookup table gain values may be stored. According to this embodiment, the method includes receiving an input data sample, and identifying, based on the input data sample, consecutive lookup table entries of the multiple lookup table entries. This embodiment further includes determining whether the consecutive lookup table entries have been previously updated, and performing a weighted interpolation process to produce an output gain value, wherein a previous gain value is used as at least one argument in the weighted interpolation process when at least one of the consecutive lookup table entries has not been updated.

Another embodiment includes a digital pre-distortion apparatus adapted to pre-distort input data samples based on gain values stored within a lookup table. According to this embodiment, the digital pre-distortion apparatus includes a gain value generator adapted to identify, based on an input data sample, a lookup table entry of the lookup table, to generate an output gain value based on a lookup table gain value stored within the lookup table entry, to update the lookup table entry by writing an updated gain value into the lookup table entry, and to update the update tracking information, corresponding to the lookup table entry, to indicate that the lookup table entry has been updated. This embodiment further includes a combiner adapted to combine the input data sample with the output gain value to produce a pre-distorted data sample.

Another embodiment includes a digital pre-distortion apparatus adapted to pre-distort input data samples based on gain values stored within a lookup table. According to this embodiment, the digital pre-distortion apparatus includes a gain value generator adapted to generate an output gain value for combination with an input data sample using at least one gain value stored within the lookup table, wherein the gain value generator is adapted to generate the output gain value by identifying, based on the input data sample, consecutive lookup table entries of the lookup table, determining whether the consecutive lookup table entries have been previously updated, and performing a weighted interpolation process to produce the output gain value, wherein a previous gain value is used as at least one argument in the weighted interpolation process when at least one of the consecutive lookup table entries has not been updated. This embodiment further includes a combiner adapted to combine the input data sample with the output gain value to produce a pre-distorted data sample.

While the principles of the inventive subject matter have been described above in connection with specific systems, apparatus, and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A method for performing digital pre-distortion in a system that includes a lookup table, wherein the lookup table includes multiple lookup table entries within which lookup table gain values are storable, the method comprising:

receiving an input data sample;

identifying, based on the input data sample, a first lookup table entry of the lookup table;

updating the first lookup table entry by writing an updated gain value into the first lookup table entry; and updating update tracking information for the first lookup table entry by updating a value stored within a first entry of an update tracking table, wherein the value indicates whether the first lookup table entry has been updated at least one time from an initial value, the update tracking table is distinct from the lookup table, and the update tracking table includes multiple update tracking table entries, each one of the multiple update tracking table entries corresponding to one of the multiple lookup table entries, and wherein updating the update tracking information includes modifying the update tracking information to indicate that the first lookup table entry has been updated.

2. The method of claim 1, further comprising:
initializing the update tracking information to indicate that the multiple lookup table entries have not been updated.

3. The method of claim 2, wherein initializing the update tracking information comprises:
initializing the update tracking information in the update tracking table.

4. The method of claim 1, wherein updating the update tracking information comprises:
incrementing the update tracking information.

5. The method of claim 1, further comprising:
initializing the lookup table by writing an initial lookup table gain value into at least some of the multiple lookup table entries.

6. The method of claim 1, further comprising:
determining whether an adjacent lookup table entry to the first lookup table entry has not been updated; and
when the adjacent lookup table entry has not been updated, writing the updated gain value into the adjacent lookup table entry.

7. The method of claim 6, wherein determining whether the adjacent lookup table entry has not been updated comprises:
evaluating the update tracking information corresponding to the adjacent lookup table entry.

8. The method of claim 1, further comprising:
determining whether an adjacent lookup table entry has been updated fewer than a threshold number of times; and
when the adjacent lookup table entry has been updated fewer than the threshold number of times, writing the updated gain value into the adjacent lookup table entry.

9. A method for performing digital pre-distortion in a system that includes a lookup table, wherein the lookup table includes multiple lookup table entries within which lookup table gain values are storable, the method comprising:
receiving an input data sample;
identifying, based on the input data sample, consecutive lookup table entries of the multiple lookup table entries;
determining whether the consecutive lookup table entries have been previously updated by evaluating update tracking information stored within an update tracking table that is distinct from the lookup table, wherein the update tracking table includes multiple update tracking table entries, each one of the multiple update tracking table entries corresponds to one of the multiple lookup table entries, and the update tracking information within each of the multiple update tracking table entries indicates whether a corresponding lookup table entry has been updated at least one time from an initial value; and
performing a weighted interpolation process to produce an output gain value, wherein a previous gain value is used as at least one argument in the weighted interpolation process when at least one of the consecutive lookup table entries has not been updated.

10. The method of claim 9, further comprising:
prior to determining whether the consecutive lookup table entries have been previously updated, initializing the update tracking information to indicate that the consecutive lookup table entries have not been updated.

11. The method of claim 9, further comprising:
updating the consecutive lookup table entries with updated gain values; and
updating the update tracking information corresponding to the consecutive lookup table entries to indicate that the consecutive lookup table entries have been updated.

12. The method of claim 9, further comprising:
storing the output gain value as the previous gain value.

13. The method of claim 9, further comprising:
prior to performing the weighted interpolation process, initializing the previous gain value.

14. The method of claim 9, further comprising:
initializing the update tracking information to indicate that the multiple lookup table entries have not been updated;
updating lookup table gain values, within the consecutive lookup table entries, by writing updated gain values into the consecutive lookup table entries;
updating the update tracking information, corresponding to the consecutive lookup table entries, to indicate that the consecutive lookup table entries have been updated;
determining whether an adjacent lookup table entry has not been updated; and
when an adjacent lookup table entry has not been updated, writing an updated gain value into the adjacent lookup table entry.

15. A digital pre-distortion apparatus adapted to pre-distort input data samples based on gain values stored within a lookup table, the digital pre-distortion apparatus comprising:
a gain value generator adapted to identify, based on an input data sample, a lookup table entry of the lookup table, to generate an output gain value based on a lookup table gain value stored within the lookup table entry, to update the lookup table entry by writing an updated gain value into the lookup table entry, and to update tracking information for the lookup table entry by updating a value stored within a first entry of an update tracking table, wherein the value indicates whether the lookup table entry has been updated at least one time from an initial value, the update tracking table is distinct from the lookup table, and the update tracking table includes multiple update tracking table entries, each one of the multiple update tracking table entries corresponding to one of the multiple lookup table entries, and wherein updating the update tracking information includes modifying the update tracking information to indicate that the lookup table entry has been updated; and
a combiner adapted to combine the input data sample with the output gain value to produce a pre-distorted data sample.

16. The apparatus of claim 15, further comprising:
a table initialization/updating element adapted to generate gain delta values for use in calculating the update gain value.

17. The apparatus of claim 15, wherein the gain value generator is further adapted to identify, based on the input data sample, consecutive lookup table entries of the lookup table, to determine whether the consecutive lookup table entries have been previously updated, and to perform a weighted interpolation process to produce the output gain value, wherein a previous gain value is used as at least one argument in the weighted interpolation process when at least one of the consecutive lookup table entries has not been updated.

18. The apparatus of claim 17, further comprising:
an interpolator adapted to perform the weighted interpolation process.

* * * * *